(12) United States Patent
Kang et al.

(10) Patent No.: US 9,087,589 B2
(45) Date of Patent: Jul. 21, 2015

(54) FLASH MEMORY DEVICE REDUCING LAYOUT AREA

(71) Applicants: FIDELIX CO., LTD., Seongnam-si, Gyeonggi-do (KR); Nemostech Co., Ltd., Seongnam-si, Gyeonggi-do (KR)

(72) Inventors: Tae Gyoung Kang, Yongin-si (KR); Hoon Mo Yoon, Yongin-si (KR)

(73) Assignees: FIDELIX CO., LTD., Seongnam-Si, Gyeonggi-Do (KR); NEMOSTECH CO., LTD., Seongnam-Si, Gyeonggi-Do (KR)

( * ) Notice: Subject to any disclaimer, the term of this patent is extended or adjusted under 35 U.S.C. 154(b) by 55 days.

(21) Appl. No.: 14/154,617

(22) Filed: Jan. 14, 2014

(65) Prior Publication Data
US 2014/0233313 A1  Aug. 21, 2014

(30) Foreign Application Priority Data
Feb. 18, 2013  (KR) .................. 10-2013-0016722

(51) Int. Cl.
*G11C 16/06* (2006.01)
*G11C 16/12* (2006.01)

(52) U.S. Cl.
CPC ............... *G11C 16/06* (2013.01); *G11C 16/12* (2013.01)

(58) Field of Classification Search
CPC ............................. G11C 16/06; G11C 16/12
USPC ............ 365/185.05, 185.24, 185.25, 189.09, 365/189.11, 189.17, 230.06
See application file for complete search history.

(56) References Cited

U.S. PATENT DOCUMENTS 5,404,336 A * 4/1995 Imai ........................ 365/230.03
6,147,915 A * 11/2000 Yanagisawa et al. ......... 365/194

* cited by examiner

*Primary Examiner* — Gene Auduong
(74) *Attorney, Agent, or Firm* — Kile Park Reed & Houtteman PLLC

(57) ABSTRACT

A flash memory device reducing a layout area is provided. In the flash memory device, even power transistors and odd power transistors of a plurality of power connection portions corresponding to a plurality of pairs of bit lines and even select transistors and odd select transistors of a plurality of select connection portions corresponding thereto are disposed in one common active region. In the flash memory device, since the number of insulation regions/layout areas for distinguishing active regions is reduced, a layout length in the vertical direction is reduced, ultimately reducing an entire required layout area considerably.

9 Claims, 5 Drawing Sheets

FLASH MEMORY DEVICE REDUCING LAYOUT AREA

CROSS-REFERENCE TO RELATED APPLICATIONS

The present application claims priority to and the benefit of Korean Patent Application No. 2013-0016722, filed on Feb. 18, 2013, the entire disclosure of which is incorporated herein by reference.

FIELD OF THE INVENTION

The present invention is directed to a semiconductor memory device, and more particularly, to a flash memory device reducing a layout area.

BACKGROUND OF THE INVENTION

With the development of mobile systems and various application systems, the demand for flash memory devices that are non-volatile memories has increased. Flash memory devices are devices that are capable of storing data even when no power is supplied to them.

The structure of a flash memory device includes a data transmission block that provides data extracted from a memory array via individual pairs of bit lines to a page buffer block through each common bit line. The data transmission block includes power connection portions controlled such that each pair of bit lines is connected to a power voltage and select connection portions controlled such that each pair of bit lines is selectively connected to each common bit line.

In recent years, with an increase in the degree of integration of semiconductor memory devices including a flash memory devices, the size (pitch) and interval (space) of a pattern are reduced by applying double patterning technology (DPT). In the flash memory device, according to DPT, wirings of the pairs of bit lines are expanded with the same pitch from the memory array to power connection portions and select connection portions at the front stage of a page buffer. In this case, at the time of layout of the data transmission block of the flash memory device, a width in the horizontal direction is limited, and a layout length in the vertical direction is increased.

SUMMARY OF THE INVENTION

Exemplary embodiments of systems and methods in accordance with the present invention are directed to flash memory devices that reduce a layout area by reducing a layout length in the vertical direction in layout of a data transmission block of the flash memory device.

In one embodiment, a flash memory device is provided having a memory array, a plurality of pairs of bit lines, a plurality of common bit lines and a data transmission block. Each pair of bit lines is connected to the memory array, wired to a first conductive layer and includes an even bit line and an odd bit line. The plurality of common bit lines is disposed to correspond to the plurality of pairs of bit lines. The data transmission block provides data extracted from the memory array via the plurality of pairs of bit lines to the common bit lines corresponding to the plurality of pairs of bit lines.

In one embodiment, the data transmission block includes a plurality of power connection portions configured to correspond to the plurality of pairs of bit lines. Each power connection portion includes an even power transistor controlled such that each even bit line is connected to a power voltage and an odd power transistor controlled such that each odd bit line is connected to the power voltage. The data transmission block also includes a plurality of select connection portions corresponding to the plurality of pairs of bit lines. Each select connection portion includes an even select transistor controlled such that each even bit line is connected to one of the common bit lines and an odd select transistor controlled such that each odd bit line is connected to one of the common bit lines. The even power transistors and the odd power transistors of the power connection portions correspond to at least two pairs of bit lines among the plurality of pairs of bit lines, and the even select transistors and the odd select transistors of the select connection portions are formed in one common active region.

In one embodiment, the plurality of power connection portions and the plurality of select connection portions corresponding to the plurality of pairs of bit lines are disposed together in one common active region. Accordingly, a layout length in the vertical direction is reduced, and an entire layout area is substantially reduced.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Figure 1:
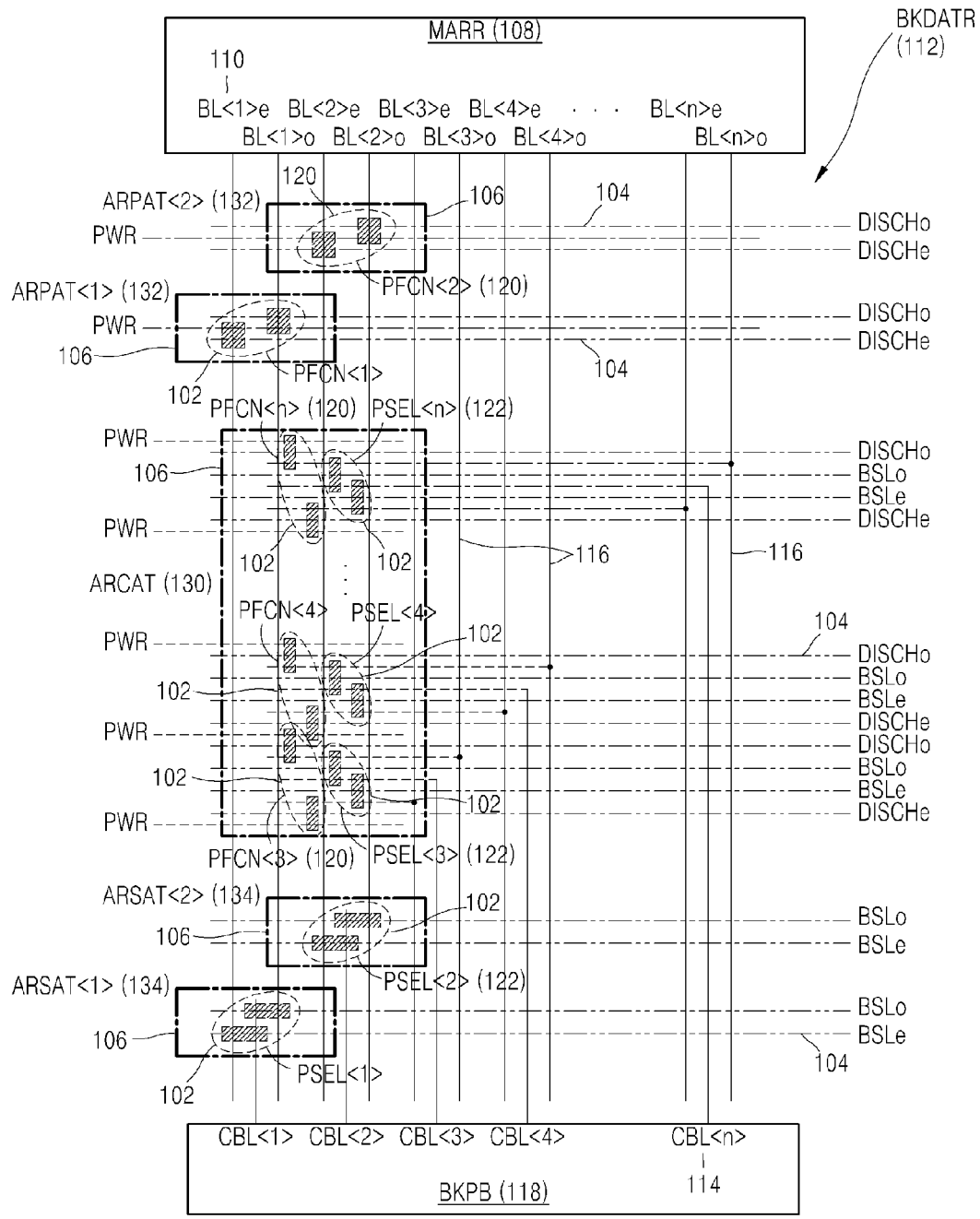
FIG. 1 is a diagram illustrating a flash memory device according to an exemplary embodiment of the present invention.

Referring initially to FIG. 1, an exemplary embodiment of a flash memory device 100 in accordance with the present invention is illustrated. The flash memory devices include a plurality of groups of constituent elements 102. Data and signals of constituent elements or constituent elements associated with wirings of the data and signals are illustrated by deviant crease lines 104. The flash memory device includes layout areas 106 that are used to realize the constituent elements.

The flash memory device includes a memory array MARR 108, a plurality, $1^{st}$ to $n^{th}$, of pairs of bit lines 110, e.g., BL<1>e/BL<1>o, BL<2>e/BL<2>o, BL<3>e/BL<3>o, ..., BL<n>e/BL<n>o, a plurality, $1^{st}$ to $n^{th}$, of common bit lines 114, e.g., CBL<1>, CBL<2>, CBL<3>, ..., CBL<n>, and a data transmission block BKDATR 112. As used herein, numerals within <> are serial numbers to distinguish constituent elements from each other. When the elements need not be distinguished using the serial numbers, it should be noted that <> and the numerals within <> are omitted. In one embodiment, the memory array MARR includes a plurality of flash memory cells (not shown). The $1^{st}$ to $n^{th}$ pairs of bit lines BL<1>e/BL<1>o, BL<2>e/BL<2>o, BL<3>e/BL<3>o, ..., BL<n>e/BL<n>o are connected to the memory array MARR and are shown expanded in one direction, i.e., the vertical direction. The pairs of bit lines are wired 116 to first conductive layers, for example, first metal layers, and include the even bit lines BL<1>e, BL<2>e, BL<3>e, ..., BL<n>e and the odd bit lines BL<1>o, BL<2>o, BL<3>o, ..., BL<n>o. The $1^{st}$ to $n^{th}$ common bit lines CBL<1>, CBL<2>, CBL<3>, ..., CBL<n> are disposed to correspond to the $1^{st}$ to $n^{th}$ pairs of bit lines BL<1>e/BL<1>o, BL<2>e/BL<2>o, BL<3>e/BL<3>o, ..., BL<n>e/BL<n>o.

The data transmission block BKDATR provides data extracted from the memory array MARR to the corresponding $1^{st}$ to $n^{th}$ common bit lines CBL<1>, CBL<2>, CBL<3>, ..., CBL<n> through the $1^{st}$ to $n^{th}$ pairs of bit lines BL<1>e/BL<1>o, BL<2>e/BL<2>o, BL<3>e/BL<3>o, ..., BL<n>e/BL<n>o. Data in the $1^{st}$ to $n^{th}$ common bit lines CBL<1>, CBL<2>, CBL<3>, ..., CBL<n> are provided to a page buffer block BKPB 118. In one exemplary embodiment, the pairs of bit lines BL<1>e/BL<1>o, BL<2>e/BL<2>o, BL<3>e/BL<3>o, ..., BL<n>e/BL<n>o are formed by double patterning technology (DPT). When the DPT is applied, the size (pitch) and space of a pattern of the pairs of bit lines BLe/BLo is reduced. Also, the pairs of bit lines BL<1>e/BL<1>o, BL<2>e/BL<2>o, BL<3>e/BL<3>o, ..., BL<n>e/BL<n>o wired based on the DPT are expanded with the same pitch from the memory array MARR to power connection portions (PFCN) and select connection portions (PSEL) at the front stage of the page buffer BKPB. Suitable DPT is readily available to one of skill in the art.

In one embodiment, the data transmission block BKDATR includes a plurality, $1^{st}$ to $n^{th}$, of power connection portions PFCN<1> to PFCN<n> 120 and a plurality, $1^{st}$ to $n^{th}$, of select connection portions PSEL<1> and PSEL<n> 122. Therefore, one pair of bit lines BLe/BLo is disposed to correspond to one power connection portion PFCN and one select connection portion PSEL.

Figure 2:
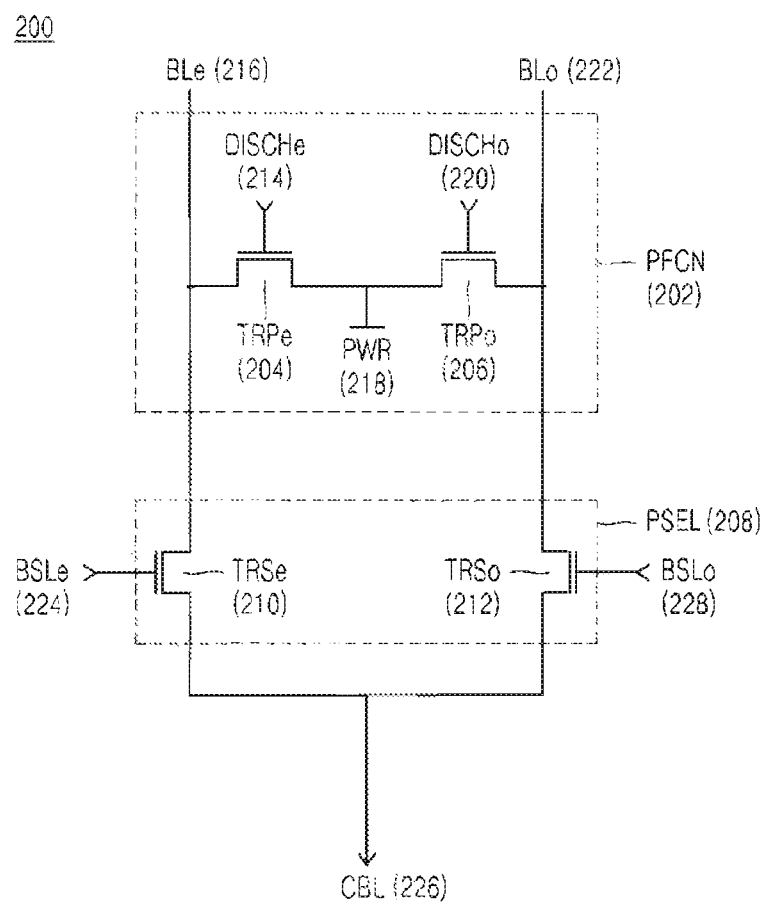
FIG. 2 is a diagram illustrating an embodiment of an equivalent circuit of a power connection portion and a select connection portion corresponding to any pair of bit lines in the flash memory device of FIG. 1.

Referring to FIG. 2, an equivalent circuit 200 of the power connection portion PFCN and the select connection portion PSEL corresponding to any one of the pairs of bit lines BLe/BLo in the flash memory device 100 is illustrated. The power connection portion 202 PFCN includes an even power transistor TRPe 204 and an odd power transistor TRPo 206. The select connection portion PSEL 208 includes an even select transistor TRSe 210 and an odd select transistor TRSo 212. The even power transistor TRPe is controlled in response to an even discharge signal DISCHe 214 such that an even bit line BLe 216 is connected to a power voltage PWR 218. In addition, the odd power transistor TRPo is controlled in response to an odd discharge signal DISCHo 220 such that an odd bit line BLo 222 is connected to the power voltage PWR 218. In addition, the even select transistor TRSe is controlled in response to an even select signal BSLe 224 such that the even bit line BLe 216 is connected to a corresponding common bit line CBL 226. The odd select transistor TRSo 212 is controlled in response to an odd select signal BSLo 228 such that the odd bit line BLo 222 is connected to the corresponding common bit line CBL 226.

Referring again to FIG. 1, a common active region ARCAT 130 is provided in the flash memory device according to the present invention. The common active region ARCAT is a region specified by one closed curved line and is a region in which an insulation region, for example, an isolation oxide region, configured to isolate adjacent active regions is excluded. Suitable methods for forming of the common active region ARCAT are known and available to those of skill in the art. In the common active region ARCAT, the even power transistors TRPe and the odd power transistors TRPo of the power connection portions PFCN corresponding to at least two pairs of bit lines BLe/BLo are disposed, and the even select transistors TRSe and the odd power transistors TRSo of the select connection portions PSEL corresponding thereto are disposed. In one embodiment, in the common active region ARCAT, the even power transistors TRPe and the odd power transistors TRPo of the $3^{rd}$ to $n^{th}$ power connection portions PFCN<3> to PFCN<n> corresponding to the $3^{rd}$ to $n^{th}$ pairs of bit lines BL<3>e/BL<3>o to BL<n>e/BL<n>o are disposed, and the even select transistors TRSe and the odd power transistors TRSo of the $3^{rd}$ to $n^{th}$ select connection portions PSEL<3> to PSEL<n> corresponding thereto are disposed. Accordingly, in the flash memory device according to the present invention, the number of the insulation regions is considerably reduced and a layout length in the vertical direction is consequently reduced, ultimately reducing the entire required layout area considerably.

Figure 3:
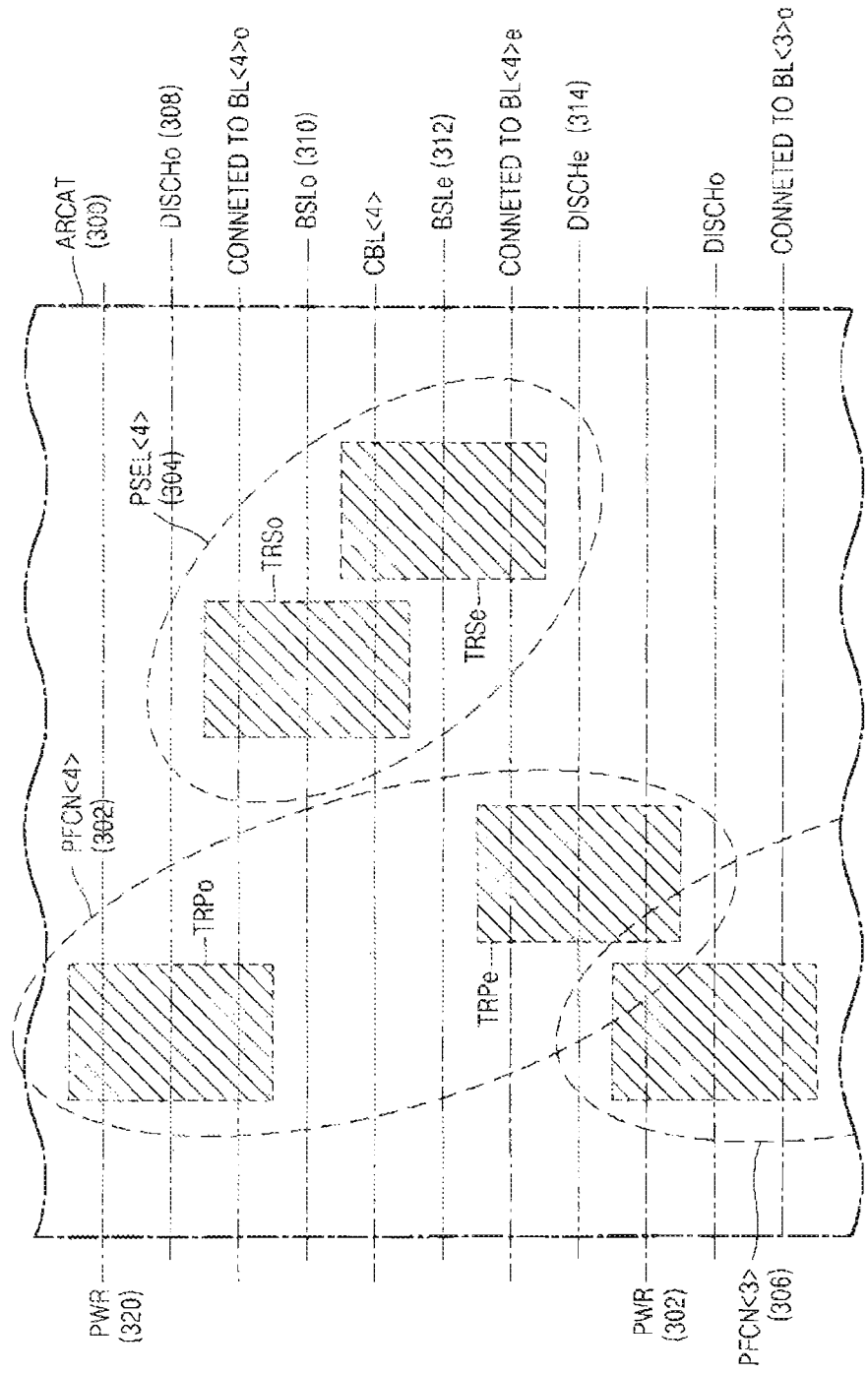
FIG. 3 is a partially expanded diagram illustrating a part of a common active region ARCAT of FIG. 1.

Referring FIG. 3, an exemplary embodiment of the common active region ARCAT 300 of FIG. 1 is illustrated. The ARCAT includes the power connection portion PFCN<4> 302 and the select connection portion PSEL<4> 304 corresponding to the pair of bit lines BL<4>e/BL<4>o. Also included is a portion of the power connection portion PFCN<3> 306 corresponding to the pair of bit lines BL<3>e/BL<3>o. In the common active region ARCAT, the odd discharge signal DISCHo 308, the odd select signal BSLo 310, the even select signal BSLe 312, and the even discharge signal DISCHe 314 corresponding to each pair of bit lines BLe/BLo are expanded and wired from top to bottom in the horizontal direction. At this time, wirings of the odd discharge signal DISCHo, the odd select signal BSLo, the even select signal BSLe, and the even discharge signal DISCHe are preferably formed on a third conductive layer, for example, a gate poly layer, which is illustrated with a thin double-dot chain line in the drawing. In the common active region ARCAT, the power voltage PWR 320, the odd bit line BLo, the common bit line CBL 322, and the even bit line BLe corresponding to each pair of bit lines BLe/BLo are expanded and wired to be crossed with wirings of the first conductive layer from top to bottom in the horizontal direction. At this time, wirings of the power voltage PWR, the odd bit line BLo, the common bit line CBL, and the even bit line BLe expanded in the horizontal direction are preferably formed on a second conductive layer, for example, a second metal layer, which is illustrated with a thin one-dot chain line in the drawing Since the respective signals are wired in this way in the common active region ARCAT, the wiring of the power voltage PWR in the common active region ARCAT is formed between the wirings of the odd discharge signal DISCHo and the even discharge signal DISCHe of mutually different pairs of bit lines BLe/BLo.

In one embodiment, the wiring of the power voltage PWR is formed between the wiring of the even discharge signal DISCHe gating the even power transistor TRPe of the power connection portion PFCN<4> corresponding to the pair of bit lines BL<4>e/BL<4>o and the odd discharge signal DISCHo gating the odd power transistor TRPo of the power connection portion PFCN<3> corresponding to the pair of bit lines BL<3>e/BL<3>o (see 'A' of FIG. 3). In addition, the wirings of the even select signal BSLe and the odd select signal BSLo of each of the pairs of bit lines BLe/BLo in the common active region ARCAT are formed between the wiring of the even discharge signal DISCHe of each of the pairs of bit lines BLe/BLo and the wiring of the odd discharge signal DISCHo of each of the pairs of bit lines BLe/BLo. On the other hand, the pairs of bit lines BLe/BLo expanded in the horizontal direction and formed on the second conductive layer are connected to the pairs of bit lines (BLe/BLo) formed on the first conductive layer and expanded in the vertical direction via contacts. In addition, each of the common bit lines CBL corresponding to the select connection portions PSEL formed in the common active region ARCAT is partially expanded and wired in the horizontal direction and is expanded and wired in the vertical direction for the remaining part. By the pairs of bit lines BLe/BLo and the common bit lines CBL having such structures, the even power transistors TRPe and the odd power transistors TRPo can be disposed to be mutually close to the even select transistors TRSe and the odd power transistors TRSo. As a result, the required layout area is further reduced.

Referring again to FIG. 1, the flash memory device further includes at least one power active region ARPAT 132 and at least one select active region ARSAT 134. The power active region ARPAT and the select active region ARSAT are regions specified by one closed curved line and are regions in which an insulation region configured to isolate adjacent active regions is excluded, as in the foregoing common active region ARCAT. Suitable methods for forming of the power active region ARPAT and the select active region ARSAT are known and available to one of skill in the art.

Figure 4:
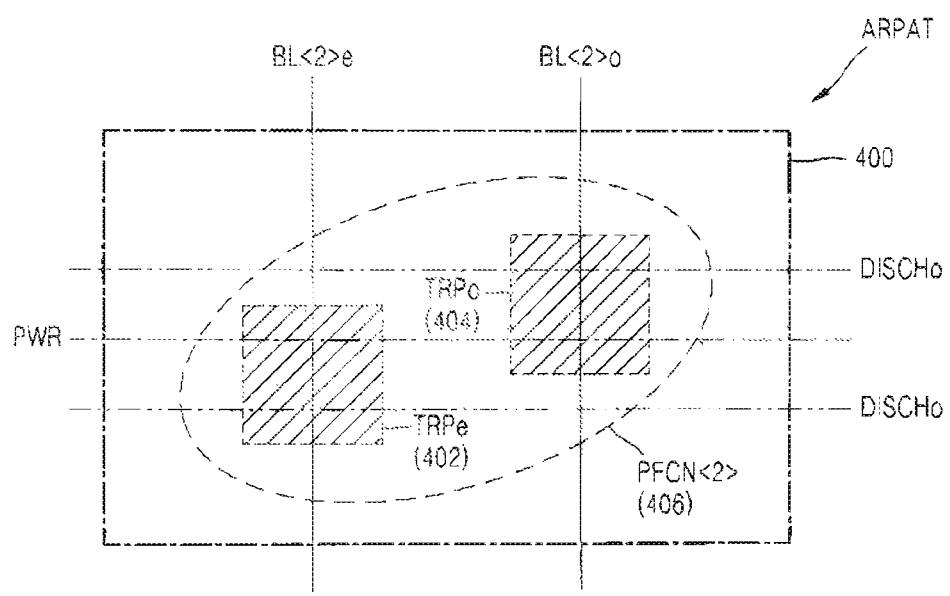
FIG. 4 is a diagram illustrating details of one of power active regions ARPAT of FIG. 1.

Referring to FIG. 4, an illustration of a suitable arrangement for any power active region ARPAT 400 is provided. In the power active region ARPAT, the even power transistor TRPe 402 and the odd power transistor TRPo 404 of the power connection portion PFCN<2> 406 corresponding to another pair of bit lines, for example, BL<2>e/BL<2>o, which is not the pair of bit lines in the common active region ARCAT, are formed.

Figure 5:
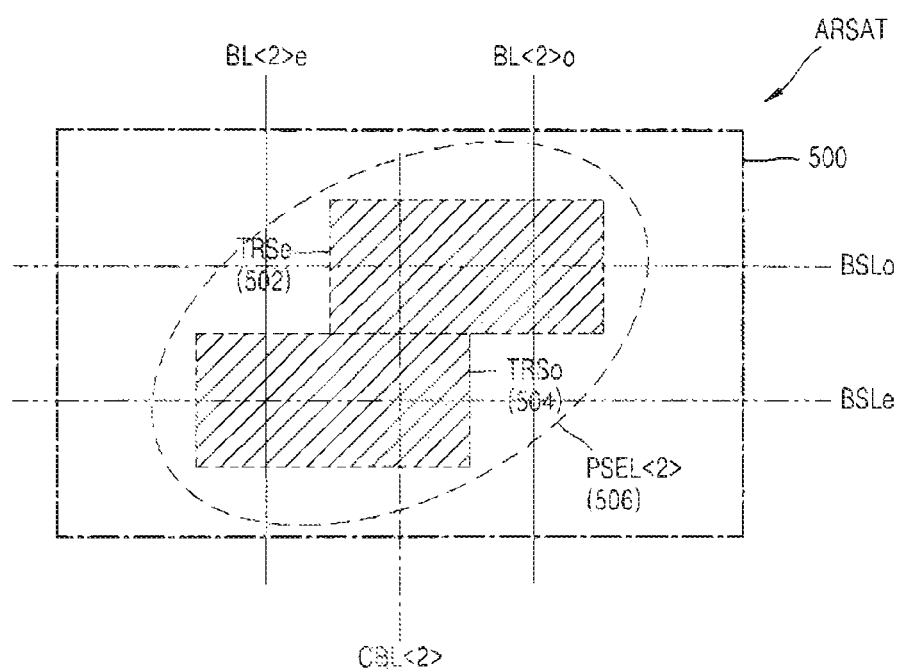
FIG. 5 is a diagram illustrating details of one of select active regions ARSAT of FIG. 1.

Referring to FIG. 5, an illustration of a suitable arrangement for any select active region ARSAT 500 is provided. In the select active region ARSAT, the even select transistor TRSe 502 and the odd select transistor TRSo 504 of the select connection portion PSEL<2>506 corresponding to another pair of bit lines, for example, BL<2>e/BL<2>o, which is not the pair of bit lines of the common active region ARCAT, are formed. Thus, mutual connection of the wirings of the power voltage PWR (not shown in FIG. 1) can easily be realized by disposing the power connection portion PFCN and the select connection portion PSEL corresponding to some of the pairs of bit lines BLe/BLo in the separate power active region ARPAT and the separate select active region ARSAT rather than the common active region ARCAT. Alternatively, in consideration of the total number of pairs of bit lines BLe/BLo or the like, it is possible to appropriately adjust a ratio of the number of pairs of bit lines BLe/BLo corresponding to the common active region ARCAT to the number of pairs of bit lines BLe/BLo corresponding to the power connection portion PFCN and the select connection portion PSEL in the flash memory device according to the present invention.

In summary, in the flash memory device in accordance with exemplary embodiments of the present invention, the even power transistors TRPe and the odd power transistors TRPo of the plurality of power connection portions PFCN corresponding to the plurality of pairs of bit lines BLe/BLo to BL<n>e/BL<n>o and the even select transistors TRSe and the odd select power transistors TRSo of the plurality of select connection portions PSEL corresponding thereto are disposed in one common active region ARCAT. Thus, with the plurality of power connection portions PFCN and the plurality of select connection portions PSEL disposed in one common active region ARCAT, the number of the insulation regions is considerably reduced compared to a level in which power active regions ARPAT and select active regions ARSAT for disposing the plurality of power connection portions PFCN and the plurality of select connection portions PSEL are each formed separately. As a result, in embodiments of the flash memory device according to the present invention, the layout length in the vertical direction is reduced, ultimately reducing the entire required layout area considerably.

The invention has been described with reference to an exemplary embodiment illustrated in the drawings, but has been merely exemplified. It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A flash memory device comprising:
a memory array;
a plurality of pairs of bit lines in communication with the memory array, each pair of bit lines comprising an even bit line and an odd bit line;
a plurality of common bit lines, each common bit line corresponding to one of the plurality of pairs of bit lines; and
a data transmission block in communication with the plurality of pairs of bit lines and the plurality of common bit lines to provide data extracted from the memory array by the plurality of pairs of bit lines to the common bit lines corresponding to the plurality of pairs of bit lines, the data transmission block comprising:
a plurality of power connection portions, each power connection portion in communication with one of the plurality of pairs of bit lines and comprising an even power transistor in communication with an even bit line of a given pair of bit lines and controlled to connect the even bit line to a power voltage and an odd power transistor in communication with an odd bit line of the given pair of bit lines and to connect the odd bit line to the power voltage;
a plurality of select connection portions configured, each select connection portion in communication with a given power connection portion and comprising an even select transistor in communication with an even bit line of the pair of bit lines associated with the given power connection and controlled to connect the associated even bit line to a given common bit line and an odd select transistor in communication with an odd bit line of the pair of bit lines associated with the given power connection and controlled to connect the associated odd bit line to the given common bit line; and
a single common active region comprising all even power transistors and odd power transistors of at least two of the plurality of power connection portions and all even select transistors and odd select transistors of the plurality of select connection portions.

2. The flash memory device of claim 1, wherein the plurality of pairs of bit lines are formed using double patterning technology.

3. The flash memory device of claim 1, wherein the single common active region further comprises:
   power voltage wiring in communication with the power voltage;
   even discharge signal wiring and odd discharge signal wiring in each one of the power connection portions in the single common active region, each even discharge signal wiring in communication with one of the even power transistors to gate that even power transistor and each odd discharge signal wiring in communication with one of the odd power transistors to gate that odd power transistor, the power voltage wiring disposed between even discharge signal wiring and odd discharge signal wiring pairs.

4. The flash memory device of claim 3, wherein the single common active region further comprises:
   even select signal wiring in communication with each even select transistor in the plurality of select connection portions to gate each even select transistor; and
   odd select signal wiring in communication with each odd select transistor in the plurality of select connection portions to gate each odd select transistor, the even selection signal wiring and odd select wiring of a given select connection portion disposed between even discharge signal wiring odd discharge signal wiring of the given select connection portion.

5. The flash memory device of claim 1, wherein each common bit line corresponding to a select connection portion disposed in the common active region is partially expanded and wired in a horizontal direction within the common action region and is expanded and wired in a vertical direction outside the common action region.

6. The flash memory device of claim 1, wherein:
   the plurality of pairs of bit lines are disposed in a first conductive layer; and
   each pair of bit lines in communication with power connection portions disposed in the common active region comprising a portion disposed in a second conductive layer and expanded in a horizontal direction.

7. The flash memory device of claim 6, wherein each common bit line is disposed in the second conductive layer.

8. The flash memory device of claim 1, wherein the data transmission block further comprises:
   at least one power active region comprising the even power transistor and the odd power transistor of a given power connection portion corresponding to a given pair of bit lines; and
   at least one select active region comprising the even select transistor and the odd select transistor of a given select connection portion corresponding to the given power connection portion.

9. A flash memory device comprising:
   a memory array;
   a plurality of pairs of bit lines in communication with the memory array, each pair of bit lines comprising an even bit line and an odd bit line;
   a plurality of common bit lines, each common bit line corresponding to one of the plurality of pairs of bit lines; and
   a data transmission block in communication with the plurality of pairs of bit lines and the plurality of common bit lines to provide data extracted from the memory array by the plurality of pairs of bit lines to the common bit lines corresponding to the plurality of pairs of bit lines, the data transmission block comprising:
   a plurality of power connection portions, each power connection portion in communication with one of the plurality of pairs of bit lines and comprising an even power transistor in communication with an even bit line of a given pair of bit lines and controlled to connect the even bit line to a power voltage and an odd power transistor in communication with an odd bit line of the given pair of bit lines and to connect the odd bit line to the power voltage;
   a plurality of select connection portions configured, each select connection portion in communication with a given power connection portion and comprising an even select transistor in communication with an even bit line of the pair of bit lines associated with the given power connection and controlled to connect the associated even bit line to a given common bit line and an odd select transistor in communication with an odd bit line of the pair of bit lines associated with the given power connection and controlled to connect the associated odd bit line to the given common bit line; and
   only three active regions, the three active regions comprising:
      a single common active region comprising all even power transistors and odd power transistors of at least two of the plurality of power connection portions and all even select transistors and odd select transistors of the plurality of select connection portions;
      a power active region comprising the even power transistor and the odd power transistor of a given power connection portion corresponding to a given pair of bit lines; and
      a select active region comprising the even select transistor and the odd select transistor of a given select connection portion corresponding to the given power connection portion;
   wherein the data transmission block comprises insulation regions only between active regions.

* * * * *